US012772524B2

(12) United States Patent
Wang et al.

(10) Patent No.: US 12,772,524 B2
(45) Date of Patent: Oct. 20, 2026

(54) nFET DEVICE AND METHOD FOR FABRICATING SAME

(71) Applicant: Hangzhou HFC Semiconductor Co., Hangzhou (CN)

(72) Inventors: Pengpeng Wang, Hangzhou (CN); Haijiang Yuan, Hangzhou (CN); Yongsheng Yang, Hangzhou (CN); Chungchiang Lin, Hangzhou (CN)

(73) Assignee: HANGZHOU HFC SEMICONDUCTOR CO., Hangzhou (CN)

( * ) Notice: Subject to any disclaimer, the term of this patent is extended or adjusted under 35 U.S.C. 154(b) by 336 days.

(21) Appl. No.: 18/653,225

(22) Filed: May 2, 2024

(65) Prior Publication Data

US 2025/0294841 A1 Sep. 18, 2025

(30) Foreign Application Priority Data

Mar. 12, 2024 (CN) ........................ 202410277667.X

(51) Int. Cl.
*H10D 62/834* (2025.01)
*H10D 62/13* (2025.01)
*H10P 32/10* (2026.01)
*H10P 32/14* (2026.01)
*H10P 34/42* (2026.01)

(52) U.S. Cl.
CPC ......... *H10D 62/834* (2025.01); *H10D 62/151* (2025.01); *H10P 32/1406* (2026.01); *H10P 32/171* (2026.01); *H10P 34/42* (2026.01)

(58) Field of Classification Search
None
See application file for complete search history.

(56) References Cited

U.S. PATENT DOCUMENTS

2018/0197734 A1* 7/2018 Chandra ............. H10D 30/797

* cited by examiner

*Primary Examiner* — Kyoung Lee
(74) *Attorney, Agent, or Firm* — MUNCY, GEISSLER, OLDS & LOWE, P.C.

(57) ABSTRACT

An nFET device and a method for fabricating the device are disclosed, in the method a phosphorus-doped epitaxial silicon layer is formed by epitaxy. Additionally, trisilicon tetraphosphide ($Si_3P_4$) is present in a heavily phosphorus-doped epitaxial silicon layer formed in the phosphorus-doped epitaxial silicon layer by performing a secondary phosphorus ion implantation process and a laser annealing process on the phosphorus-doped epitaxial silicon layer. The heavily phosphorus-doped epitaxial silicon layer has a thickness ranging from 20 nm to 30 nm and the trisilicon tetraphosphide has a lattice constant smaller than that of silicon.

11 Claims, 4 Drawing Sheets nFET DEVICE AND METHOD FOR FABRICATING SAME

CROSS-REFERENCE TO RELATED APPLICATION

This application claims the priority of Chinese patent application number 202410277667.X, filed on Mar. 12, 2024 and entitled "nFET DEVICE AND METHOD FOR FABRICATING SAME", the entire contents of which are incorporated herein by reference.

TECHNICAL FIELD

The present invention relates to the field of semiconductor technology and, in particular, to an nFET device and a method for fabricating the device.

BACKGROUND

Semiconductor devices have been widely used in our lives. As the manufacturing of semiconductor devices is scaling up, their performance has been greatly enhanced. However, it is well known that, for a semiconductor device, there is a tradeoff between its conduction current Ion and cut off current Ioff. Therefore, to improve the performance of a semiconductor device, it is very important to increase its conduction current Ion at a given cut off current Ioff.

SUMMARY OF THE INVENTION

It is an object of the present invention to provide an nFET device and a method for fabricating the device, which can overcome the problem with the prior art that, for an nFET device, it is challenging to increase its conduction current Ion at a given cut off current Ioff.

To this end, the present invention provides a method for fabricating an nFET device, which comprises:

- providing a substrate structure comprising a semiconductor substrate and at least one gate structure formed on the semiconductor substrate;
- forming openings in the semiconductor substrate on opposite sides of each gate structure;
- growing, by epitaxy, a phosphorus-doped epitaxial silicon layer in the openings;
- performing a secondary phosphorus ion implantation process on the phosphorus-doped epitaxial silicon layer; and
- forming a heavily phosphorus-doped epitaxial silicon layer by performing a laser annealing process on the phosphorus-doped epitaxial silicon layer, thereby forming source and drain structures, the heavily phosphorus-doped epitaxial silicon layer extending from a surface of the phosphorus-doped epitaxial silicon layer into the phosphorus-doped epitaxial silicon layer, the source and drain structure comprising the phosphorus-doped epitaxial silicon layer and the heavily phosphorus-doped epitaxial silicon layer,
- wherein the heavily phosphorus-doped epitaxial silicon layer contains trisilicon tetraphosphide and has a thickness in a range of 20 nm to 30 nm.

The present invention further comprises an nFET device comprising:

- a semiconductor substrate;
- at least one gate structure formed on the semiconductor substrate; and

- source and drain structures formed in the semiconductor substrate on opposite sides of the gate structure, the source and drain structure comprising a phosphorus-doped epitaxial silicon layer and a heavily phosphorus-doped epitaxial silicon layer extending from a surface of the phosphorus-doped epitaxial silicon layer into the phosphorus-doped epitaxial silicon layer,
- wherein the heavily phosphorus-doped epitaxial silicon layer contains trisilicon tetraphosphide and has a thickness in the range of 20 nm to 30 nm.

In the method of the present invention, forming the phosphorus-doped epitaxial silicon layer by epitaxy allows the resulting phosphorus-doped epitaxial silicon layer to have improved quality and reliability. Additionally, trisilicon tetraphosphide ($Si_3P_4$) is present in the heavily phosphorus-doped epitaxial silicon layer formed in the phosphorus-doped epitaxial silicon layer by performing the secondary phosphorus ion implantation and laser annealing processes on the phosphorus-doped epitaxial silicon layer. The heavily phosphorus-doped epitaxial silicon layer has a thickness ranging from 20 nm to 30 nm and the trisilicon tetraphosphide has a lattice constant smaller than that of silicon. As a result, tensile stress is caused, which enables a greater saturation current Idsat at a given cut off current Ioff. That is, an increased conduction current Ion can be achieved at a given cut off current Ioff.

In these figures, 100, a semiconductor substrate; 110, a gate structure; 111, a gate dielectric layer; 112, a conductive layer; 113, a titanium nitride layer; 120, a first dielectric layer; 130, a lightly-doped source and drain region; 131, a first lightly-doped source and drain region; 132, a second lightly-doped source and drain region; 140, a second dielectric layer; 150, a spacer; 160, an opening; 161, a first opening; 162, a second opening; 170, a phosphorus-doped epitaxial silicon layer; 180, a heavily phosphorus-doped epitaxial silicon layer; 190, a source and drain structure; 191, a first source and drain structure; 192, a second source and drain structure; 200, an interlayer dielectric layer; 210, a gate contact structure; 220, a source and drain contact structure; 221, a first source and drain contact structure; and 222, a second source and drain contact structure.

DETAILED DESCRIPTION

Below, reference is made to FIGS. 1 to 7, which schematically illustrate intermediate device structures resulting from process steps in a method for fabricating an nFET device according to embodiments of the present invention.

Figure 1:
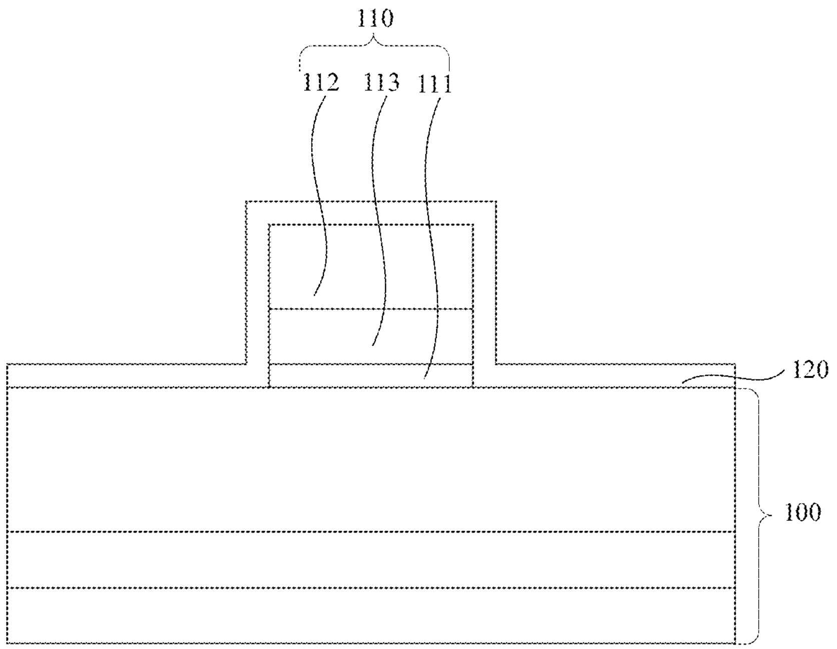
FIG. 1 is a schematic illustration of an intermediate device structure formed after a gate structure is formed on a semiconductor substrate according to an embodiment of the present invention.

As shown in FIG. 1, a semiconductor substrate 100 is provided. The semiconductor substrate 100 may be bulk silicon, silicon-on-insulator (SOI) or the like. A P-well is formed in the semiconductor substrate 100. Subsequently, a gate structure 110 is formed on the semiconductor substrate 100. The gate structure 110 includes a gate dielectric layer 111 and a conductive layer 112 formed on the gate dielectric layer 111. The gate dielectric layer 111 may be made of a high dielectric constant (k>3.9) or low dielectric constant (k≤3.9) material. The conductive layer 112 may be made of polysilicon. In addition, a titanium nitride (TiN) layer 113 may be formed between the gate dielectric layer 111 and the conductive layer 112 in order to improve the quality and reliability of the gate structure 110. In embodiments of the present application, a first dielectric layer 120 is formed on the semiconductor substrate 100, which covers the semiconductor substrate 100 and extends over the gate structure 110. The first dielectric layer 120 may be formed of, for example, silicon oxide, silicon nitride or the like. The first dielectric layer 120 can protect the semiconductor substrate 100 and the gate structure 110 in the subsequent processes.

Figure 2:
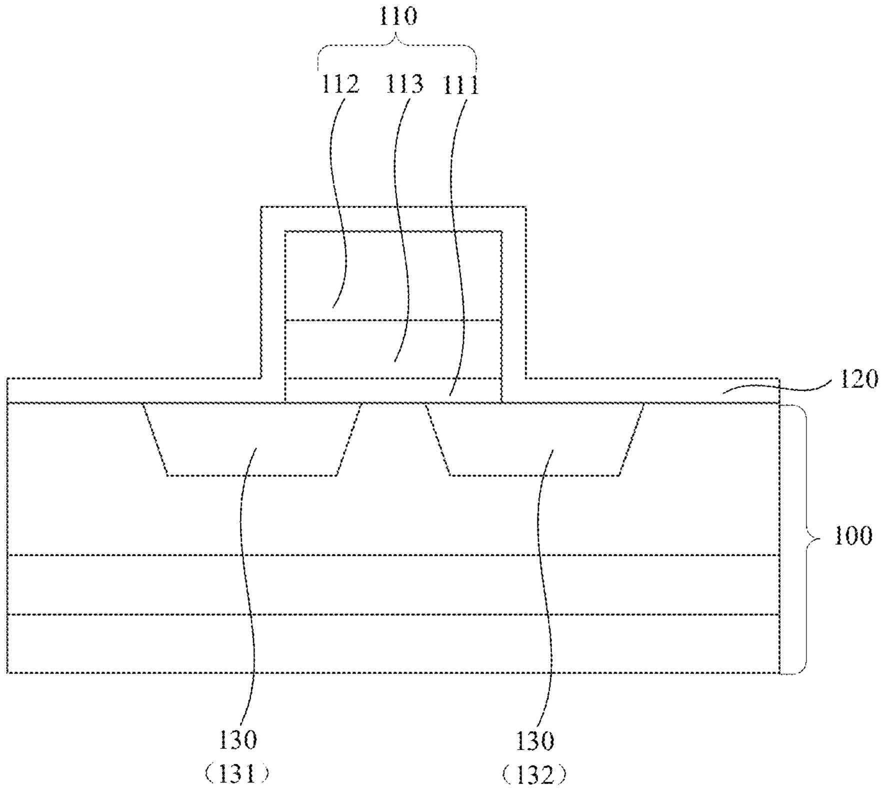
FIG. 2 is a schematic illustration of an intermediate device structure formed after lightly-doped source and drain regions are formed in the semiconductor substrate according to an embodiment of the present invention.

As shown in FIG. 2, an ion implantation process is performed on the semiconductor substrate 100 to form lightly-doped source and drain regions 130 in the semiconductor substrate 100. The lightly-doped source and drain regions includes at least one first lightly-doped source and drain region 131 and at least one second lightly-doped source and drain region 132, which extend from the semiconductor substrate 100 under the gate structure 110 respectively to the semiconductor substrate 100 on opposite sides of the gate structure 110. The lightly-doped source and drain regions 130 may be an N-type region. The first lightly-doped source and drain region 131 may be a lightly-doped source region, and the second lightly-doped source and drain region 132 may be a lightly-doped drain region. Alternatively, the first lightly-doped source and drain region 131 may be a lightly-doped drain region, and the second lightly-doped source and drain region 132 may be a lightly-doped source region.

Figure 3:
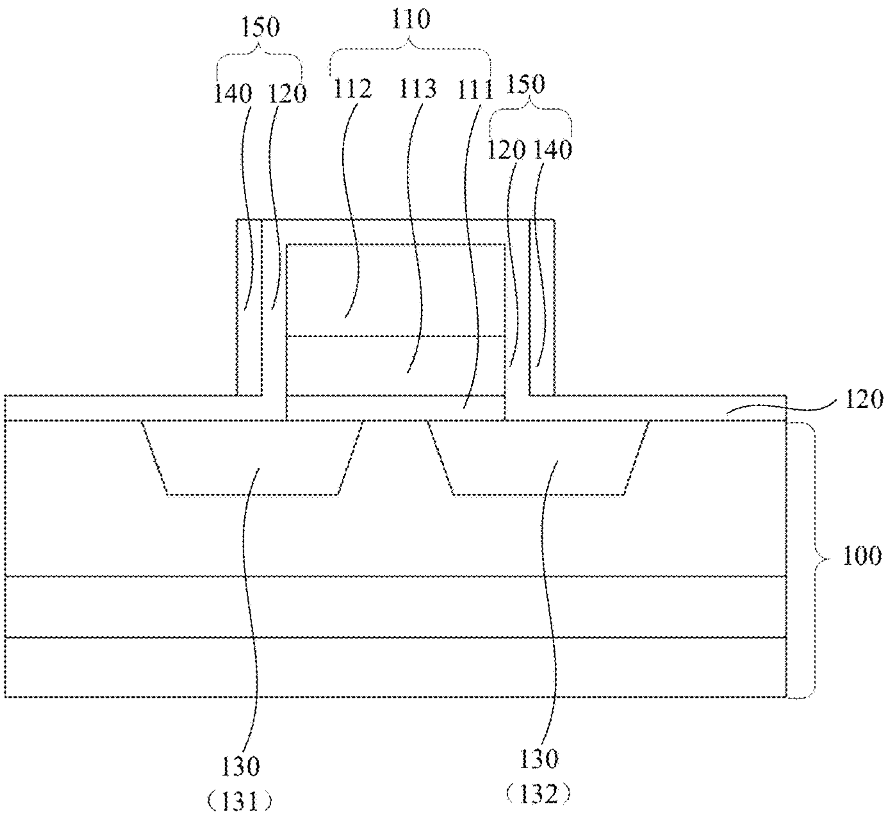
FIG. 3 is a schematic illustration of an intermediate device structure formed after spacers are formed on opposite sides of the gate structure according to an embodiment of the present invention.

Referring to FIG. 3, a second dielectric layer 140 is formed on opposite sides of the gate structure 110. The second dielectric layer 140 covers the first dielectric layer 120 on sidewalls of the gate structure 110. The first dielectric layer 120 and the second dielectric layer 140 on the sidewalls of the gate structure 110 together serve as spacers 150. The first dielectric layer 120 and the second dielectric layer 140 may be either the same or different materials. For example, the first dielectric layer 120 may be silicon oxide, and the second dielectric layer 140 may be silicon nitride.

In embodiments of the present application, the semiconductor substrate 100, the gate structure 110 formed on the semiconductor substrate 100, the spacers 150 formed on the semiconductor substrate 100 and covering the gate structure 110 and the lightly-doped source and drain regions 130 formed in the semiconductor substrate 100 constitute a substrate structure.

Figure 4:
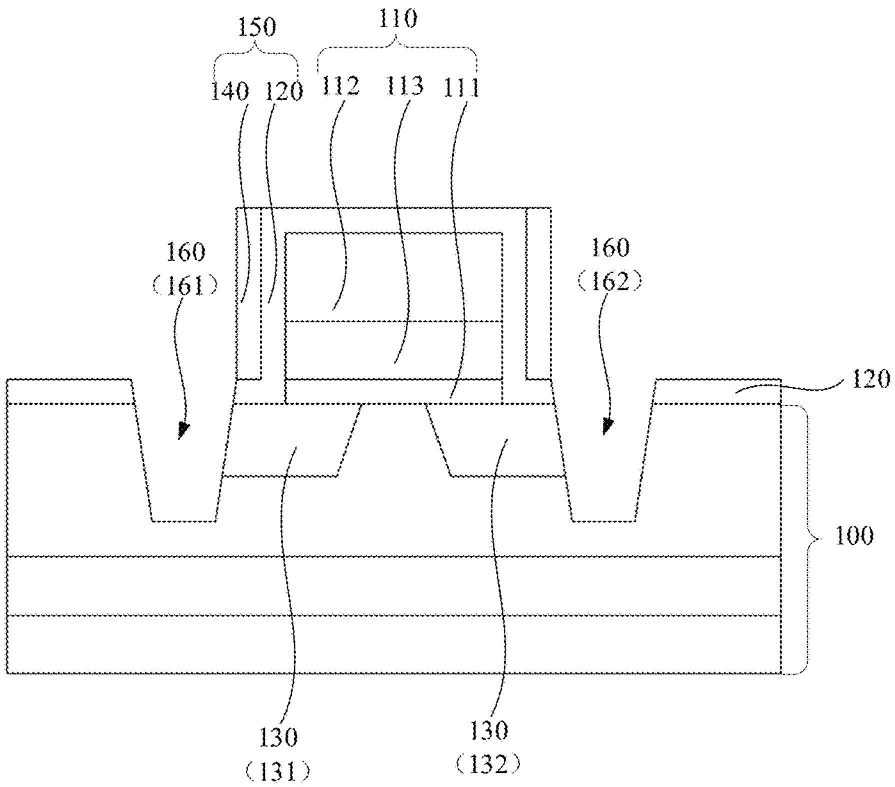
FIG. 4 is a schematic illustration of an intermediate device structure formed after openings are formed in the semiconductor substrate according to an embodiment of the present invention.

Subsequently, as shown in FIG. 4, openings 160 are formed in the semiconductor substrate 100 on opposite sides of the gate structure 110. Specifically, the openings 160 may be formed using an etching process. In embodiments of the present application, the openings 160 are adjacent to the spacers 150 and extend from the surface of the semiconductor substrate 100 into the semiconductor substrate 100. Moreover, the openings 160 extend through the lightly-doped source and drain regions 130 into the semiconductor substrate 100. That is, the bottom of the openings 160 is deeper than that of the lightly-doped source and drain regions. Specifically, the openings 160 include a first opening 161 and a second opening 162. The first opening 161 extends through the first lightly-doped source and drain region 131 into the semiconductor substrate 100, and the remaining portion of the first lightly-doped source and drain region 131 is located on one side of the first opening 161. The second opening 162 extends through the second lightly-doped source and drain region 132 into the semiconductor substrate 100, and the remaining portion of the second lightly-doped source and drain region 132 is located on one side of the second opening 162.

Figure 5:
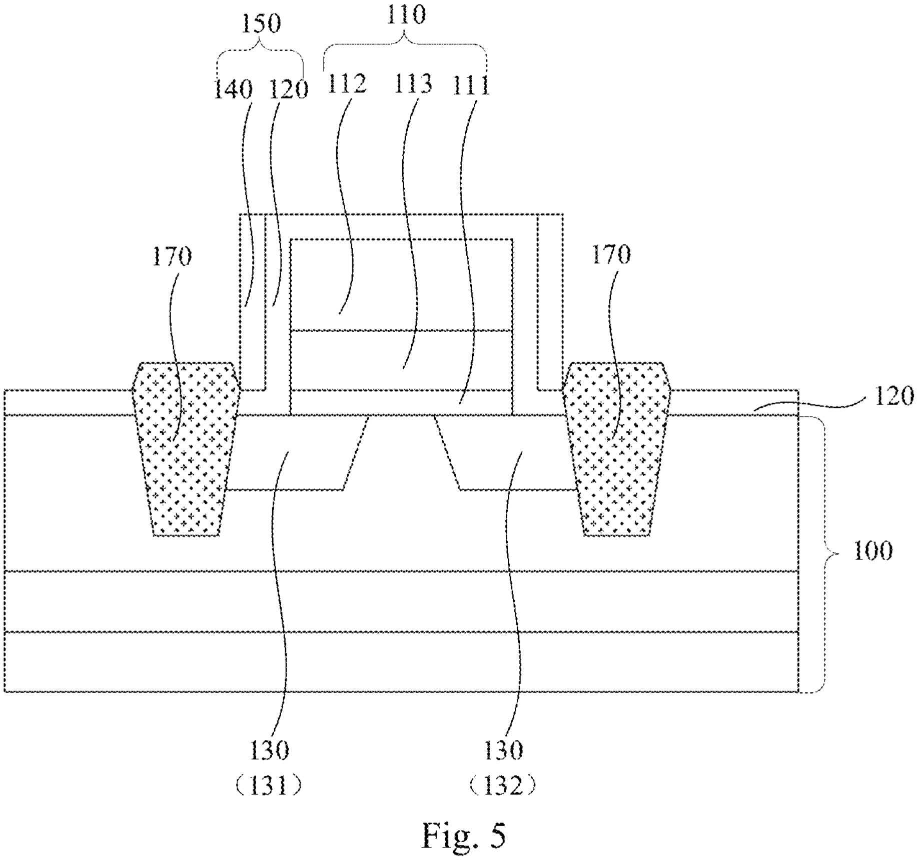
FIG. 5 is a schematic illustration of an intermediate device structure formed after a phosphorus-doped epitaxial silicon layer is formed according to an embodiment of the present invention.

Next, as shown in FIG. 5, a phosphorus-doped epitaxial silicon layer 170 is grown by epitaxy in the openings 160. The phosphorus-doped epitaxial silicon layer 170 fills up the openings 160 and protrudes the openings 160. Moreover, the surface of the phosphorus-doped epitaxial silicon layer 170 is higher than the surface of the first dielectric layer 120 covering the semiconductor substrate 100. In embodiments of the present application, phosphorus ions are implanted into the epitaxial silicon layer during its epitaxial growth, thereby forming the phosphorus-doped epitaxial silicon layer 170. The simultaneous epitaxial growth and phosphorus ion implantation allow desirable implantation of phosphorus ions and can improve the quality of the resulting phosphorus-doped epitaxial silicon layer 170. The doping concentration of phosphorus ions may range from 1.0e20 $cm^{-3}$ to 8.0e20 $cm^{-3}$.

Figure 6:
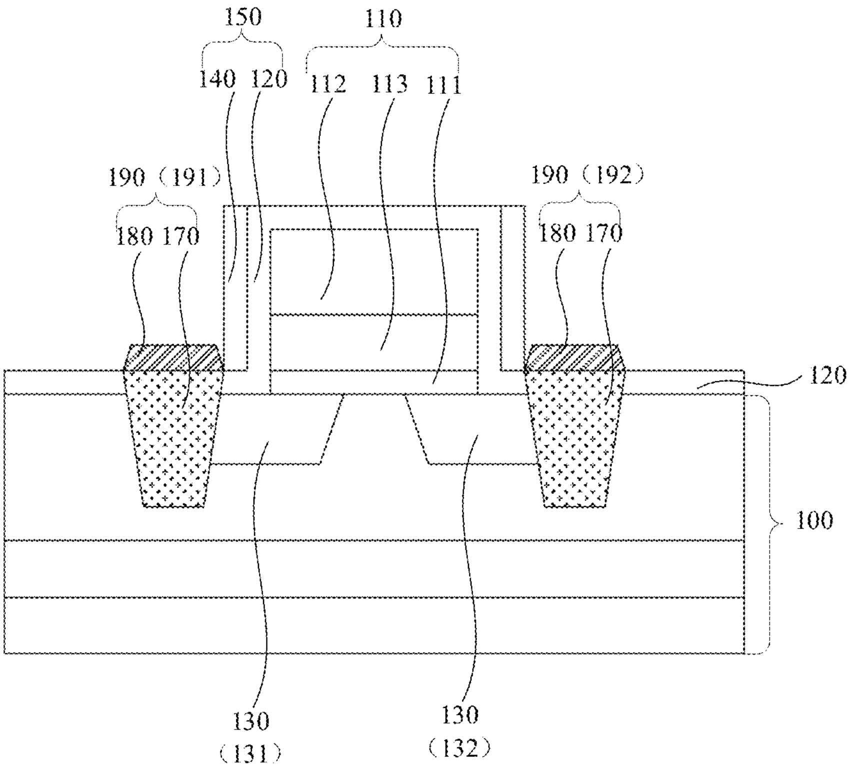
FIG. 6 is a schematic illustration of an intermediate device structure formed after source and drain structures are formed according to an embodiment of the present invention.

As shown in FIG. 6, in embodiments of the present application, a secondary phosphorus ion implantation process is performed on the phosphorus-doped epitaxial silicon layer 170. That is, after the phosphorus-doped epitaxial silicon layer 170 is formed by simultaneous epitaxial growth and phosphorus ion implantation, another phosphorus ion implantation process is performed to implant additional phosphorus ions into the phosphorus-doped epitaxial silicon layer 170. The additional phosphorus ions may be implanted in a direction substantially perpendicular to the surface of the phosphorus-doped epitaxial silicon layer 170 with energy of 4 KeV to 6 KeV at a dose ranging from 1.0e15 $cm^{-2}$ to 1.0e16 $cm^{-2}$.

With continued reference to FIG. 6, a laser annealing process is then performed on the phosphorus-doped epitaxial silicon layer 170 to activate the implanted phosphorus ions and form a heavily phosphorus-doped epitaxial silicon layer 180 in the phosphorus-doped epitaxial silicon layer 170, thereby forming source and drain structures 190. The heavily phosphorus-doped epitaxial silicon layer 180 extends from the surface of the phosphorus-doped epitaxial silicon layer 170 into the phosphorus-doped epitaxial silicon layer 170. Due to the secondary phosphorus ion implantation process performed on the phosphorus-doped epitaxial silicon layer 170, the heavily phosphorus-doped epitaxial silicon layer 180 with a higher phosphorus ion concentration is formed as a result of the laser annealing process performed on the phosphorus-doped epitaxial silicon layer 170. That is, the phosphorus ion concentration of the heavily phosphorus-doped epitaxial silicon layer 180 is higher than the phosphorus ion concentration of the phosphorus-doped epitaxial silicon layer 170. The heavily phosphorus-doped epitaxial silicon layer 180 with a higher phosphorus ion concentration has a thickness in the range of 20 nm to 30 nm, and trisilicon tetraphosphide is present therein. The trisilicon tetraphosphide has a lattice constant smaller than a lattice constant of silicon. As a result, tensile stress is caused, which enables a greater saturation current Idsat at a given cut off current Ioff. That is, an increased conduction current Ion can be achieved at a given cut off current Ioff.

The heavily phosphorus-doped epitaxial silicon layer 180 may further include other silicon-phosphorus compounds of different crystal phases, such as silicon phosphide (SIP). Preferably, the trisilicon tetraphosphide is a predominant component of the heavily phosphorus-doped epitaxial silicon layer 180 and present at a percentage higher than 50%. More preferably, the trisilicon tetraphosphide takes up 70% or more of all the silicon-phosphorus compounds in the heavily phosphorus-doped epitaxial silicon layer 180. More desirable tensile stress can be obtained by increasing the percentage of the trisilicon tetraphosphide, thereby enabling an even greater conduction current Ion at a given cut off current Ioff.

As shown in FIG. 6, the source and drain structures 190 include the phosphorus-doped epitaxial silicon layer 170 and the heavily phosphorus-doped epitaxial silicon layer 180 in the phosphorus-doped epitaxial silicon layer 170. The source and drain structures 190 may include a first source and drain structure 191 and a second source and drain structure 192, which are formed in the first opening 161 and the second opening 162, respectively. The first source and drain structure 191 may be a source region, and the second source and drain structure 192 may be a drain region. Alternatively, the first source and drain structure 191 may be a drain region, and the second source and drain structure 192 may be a source region.

Specifically, the laser annealing process may be performed on the phosphorus-doped epitaxial silicon layer 170 to form the heavily phosphorus-doped epitaxial silicon layer 180 at a temperature in the range of 1200° C. to 1250° C. for 1 μs to 10 μs. This rapid high-temperature laser annealing process allows the resulting heavily phosphorus-doped epitaxial silicon layer 180 to have better quality. Moreover, it can prevent damage to the phosphorus-doped epitaxial silicon layer 170 underlying the heavily phosphorus-doped epitaxial silicon layer 180, allowing the source and drain structures 190 to have improved quality and reliability.

Figure 7:
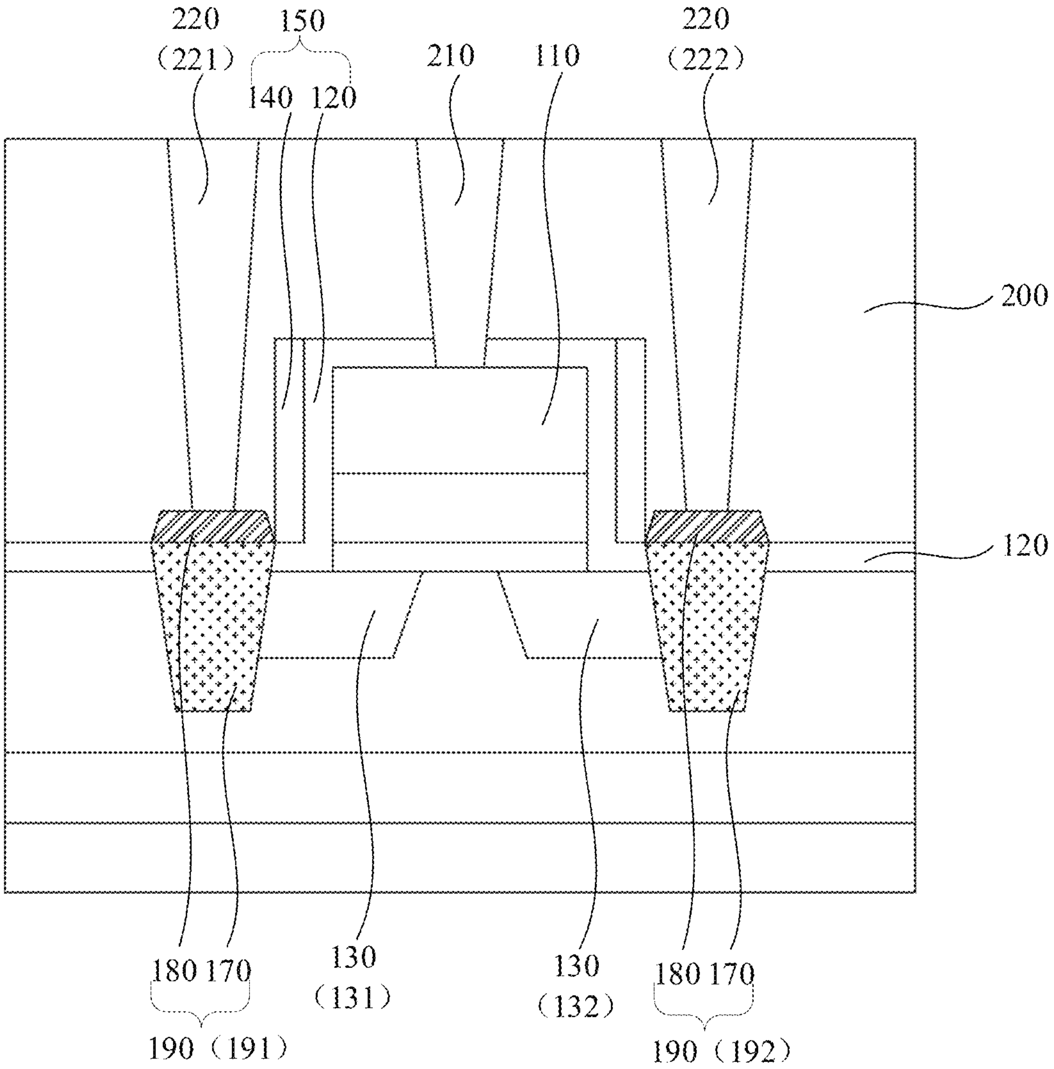
FIG. 7 is a schematic illustration of an intermediate device structure formed after an interlayer dielectric layer is formed according to an embodiment of the present invention.

Referring to FIG. 7, in embodiments of the present application, an interlayer dielectric layer 200 is formed, which covers the gate structure 110, the source and drain structures 190 and the semiconductor substrate 100. Specifically, the interlayer dielectric layer 200 may be formed using a chemical vapor deposition (CVD), physical vapor deposition (PVD) or another process. The material of the interlayer dielectric layer 200 can be the same as the first dielectric layer 120, while different from the second dielectric layer 140. For example, the interlayer dielectric layer 200 and the first dielectric layer 120 may be made of silicon oxide, and the second dielectric layer 140 may be a silicon nitride layer.

Afterwards, a gate contact structure 210 and source and drain contact structures 220 are formed in the interlayer dielectric layer 200. The gate contact structure 210 is connected to the gate structure 110, and the source and drain contact structures 220 are connected to the source and drain structures 190. The source and drain contact structures 220 may include a first source and drain contact structure 221 and a second source and drain contact structure 222. The first source and drain contact structure 221 and the second source and drain contact structure 222 are connected to the first source and drain structure 191 and the second source and drain structure 192, respectively. Specifically, the interlayer dielectric layer 200 may be etched to form contact holes therein, which expose portions of the gate structure 110 and the source and drain structures 190. A conductive material may be then filled into the contact holes to form the gate contact structure 210 and the source and drain contact structures 220.

With continued reference to FIGS. 6 and 7, in the present application, there is also provided an nFET device, which includes: a semiconductor substrate 100; a gate structure 110 formed on the semiconductor substrate 100; and source and drain structures 190 formed in the semiconductor substrate 100 on opposite sides of the gate structure 110. The source and drain structures 190 include a phosphorus-doped epitaxial silicon layer 170 and a heavily phosphorus-doped epitaxial silicon layer 180 extending from the surface of the phosphorus-doped epitaxial silicon layer 170 into the phosphorus-doped epitaxial silicon layer 170. The heavily phosphorus-doped epitaxial silicon layer 180 contains trisilicon tetraphosphide and has a thickness ranging from 20 nm to 30 nm. The trisilicon tetraphosphide has a lattice constant smaller than that of silicon. As a result, tensile stress is caused, which enables a greater saturation current Idsat at a given cut off current Ioff. That is, an increased conduction current Ion can be achieved at a given cut off current Ioff.

The doping concentration of phosphorus ions in the phosphorus-doped epitaxial silicon layer 170 may range from 1.0e20 $cm^{-3}$ to 8.0e20 $cm^{-3}$. The heavily phosphorus-doped epitaxial silicon layer 180 may contain phosphorus ions at a concentration higher than a concentration of the phosphorus ions in the phosphorus-doped epitaxial silicon layer 170.

The nFET device may further include: an interlayer dielectric layer 200, which covers the gate structure 110, the source and drain structures 190 and the semiconductor substrate 100; and a gate contact structure 210 and source and drain contact structures 220 in the interlayer dielectric layer 200, the gate contact structure 210 connected to the gate structure 110, the source and drain contact structures 220 connected to the respective source and drain structures 190.

The description presented above is merely that of some preferred embodiments of the present invention and is not intended to limit the scope thereof in any sense. Any and all changes and modifications made by those of ordinary skill in the art based on the above teachings fall within the scope of the invention.

The invention claimed is:

1. A method for fabricating an nFET device, comprising:

providing a substrate structure, wherein the substrate structure comprises a semiconductor substrate and at least one gate structure formed on the semiconductor substrate;

forming openings in the semiconductor substrate on opposite sides of each gate structure;

growing, by epitaxy, a phosphorus-doped epitaxial silicon layer in the openings;

performing a secondary phosphorus ion implantation process on the phosphorus-doped epitaxial silicon layer; and forming a heavily phosphorus-doped epitaxial silicon layer by performing a laser annealing process on the phosphorus-doped epitaxial silicon layer, thereby forming source and drain structures, wherein the heavily phosphorus-doped epitaxial silicon layer extends from a surface of the phosphorus-doped epitaxial silicon layer into the phosphorus-doped epitaxial silicon layer, and wherein the source and drain structure comprises the phosphorus-doped epitaxial silicon layer and the heavily phosphorus-doped epitaxial silicon layer, wherein the heavily phosphorus-doped epitaxial silicon layer contains trisilicon tetraphosphide and has a thickness in a range of 20 nm to 30 nm.

2. The method of claim 1, wherein in the phosphorus-doped epitaxial silicon layer grown by epitaxy in the openings, a doping concentration of phosphorus ions is in a range of 1.0e20 $cm^{-3}$ to 8.0e20 $cm^{-3}$.

3. The method of claim 1, wherein in the secondary phosphorus ion implantation process performed on the phosphorus-doped epitaxial silicon layer, phosphorus ions are implanted with energy of 4 KeV to 6 KeV at a dose of 1.0 e15 $cm^{-2}$ to 1.0e16 $cm^{-2}$.

4. The method of claim 1, wherein the heavily phosphorus-doped epitaxial silicon layer is formed by performing the laser annealing process on the phosphorus-doped epitaxial silicon layer at a temperature of 1200° C. to 1250° C. for 1 μs to 10 μs.

5. The method of claim 1, wherein the substrate structure further comprises spacers formed on the semiconductor substrate on opposite sides of the gate structure and lightly-doped source and drain regions on the semiconductor substrate.

6. The method of claim 5, wherein the opening extends through the lightly-doped source and drain region, and a bottom of the opening is lower than a bottom of the lightly-doped source and drain region.

7. The method of claim 1, further comprising:

forming an interlayer dielectric layer, wherein the interlayer dielectric layer covers the at least one gate structure, the source and drain structures and the semiconductor substrate; and forming at least one gate contact structure and source and drain contact structures in the interlayer dielectric layer, wherein the gate contact structure is connected to the gate structure, and wherein each source and drain contact structure is connected to a corresponding source and drain structure.

8. An nFET device, comprising:

a semiconductor substrate;

at least one gate structure formed on the semiconductor substrate; and source and drain structures formed in the semiconductor substrate on opposite sides of the gate structure, wherein the source and drain structure comprises a phosphorus-doped epitaxial silicon layer and a heavily phosphorus-doped epitaxial silicon layer extending from a surface of the phosphorus-doped epitaxial silicon layer into the phosphorus-doped epitaxial silicon layer, wherein the heavily phosphorus-doped epitaxial silicon layer contains trisilicon tetraphosphide and has a thickness in a range of 20 nm to 30 nm.

9. The method of claim 8, wherein a doping concentration of phosphorus ions in the phosphorus-doped epitaxial silicon layer is in a range of 1.0e20 $cm^{-3}$ to 8.0e20 $cm^{-3}$, and wherein a doping concentration of phosphorus ions in the heavily phosphorus-doped epitaxial silicon layer is higher than a doping concentration of the phosphorus ions in the phosphorus-doped epitaxial silicon layer.

10. The method of claim 8, further comprising:

an interlayer dielectric layer covering the at least one gate structure, the source and drain structures and the semiconductor substrate; and at least one gate contact structure and source and drain contact structures formed in the interlayer dielectric layer, wherein the gate contact structure is connected to the gate structure, and wherein each source and drain contact structure is connected to a corresponding source and drain structure.

11. The method of claim 9, further comprising:

an interlayer dielectric layer covering the least one gate structure, the source and drain structures and the semiconductor substrate; and at least one gate contact structure and source and drain contact structures formed in the interlayer dielectric layer, wherein the gate contact structure is connected to the gate structure, and wherein each source and drain contact structure is connected to a corresponding source and drain structure.

* * * * *